US010381307B1

(12) United States Patent
Lien

(10) Patent No.: US 10,381,307 B1
(45) Date of Patent: Aug. 13, 2019

(54) METHOD OF FORMING BARRIER LAYER OVER VIA, AND VIA STRUCTURE FORMED THEREOF

(71) Applicant: NANYA TECHNOLOGY CORPORATION, New Taipei (TW)

(72) Inventor: Wen-Hua Lien, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/978,193

(22) Filed: May 14, 2018

(51) Int. Cl.
*H01L 23/48* (2006.01)
*H01L 23/52* (2006.01)
*H01L 29/40* (2006.01)
*H01L 23/532* (2006.01)
*H01L 21/768* (2006.01)
*H01L 23/498* (2006.01)

(52) U.S. Cl.
CPC .. *H01L 23/53238* (2013.01); *H01L 21/76843* (2013.01); *H01L 23/49827* (2013.01)

(58) Field of Classification Search
USPC .......................... 257/753, E23.16, E21.584, 257/E21.575–E21.297, E21.627, E21.641, 257/774; 438/644, 654, 118, 628
See application file for complete search history.

(56) References Cited

U.S. PATENT DOCUMENTS

| | | | | |
|---|---|---|---|---|
| 2004/0115897 A1* | 6/2004 | Inoue | ................. | H01L 21/76224 438/424 |
| 2004/0140196 A1* | 7/2004 | Gopalraja | ............. | C23C 14/046 204/192.12 |
| 2004/0168908 A1* | 9/2004 | Friedemann | ............ | C23C 14/34 204/192.17 |
| 2005/0233582 A1* | 10/2005 | Friedemann | ........ | H01L 21/2855 438/672 |
| 2006/0148246 A1 | 7/2006 | Lee | | |
| 2012/0126409 A1* | 5/2012 | Cohen | ................. | H01L 21/2855 257/751 |
| 2014/0264911 A1* | 9/2014 | Lin | ........................ | H01L 23/481 257/774 |
| 2015/0311161 A1* | 10/2015 | Arvin | ................ | H01L 23/53238 257/751 |
| 2015/0333012 A1* | 11/2015 | Chang | ............... | H01L 21/76816 257/751 |
| 2019/0067436 A1* | 2/2019 | Wu | ......................... | H01L 29/45 |

FOREIGN PATENT DOCUMENTS

TW            200536050 A      11/2005

* cited by examiner

*Primary Examiner* — Niki H Nguyen
(74) *Attorney, Agent, or Firm* — CKC & Partners Co., LLC

(57) ABSTRACT

The present invention provides a method of forming a barrier layer over a via or a trench. The method includes generating a high density plasma in a chamber and depositing a barrier material over the via or the trench by using the high density plasma. The depositing of the barrier material comprises at least a first deposition step, a second deposition step and a third deposition step in sequence. The first, second and third deposition steps is respectively performed under a first bias power, a second bias power and a third bias power. The third bias power is greater than the second bias power, and the second bias power is greater than the first bias power. The present invention also provides a via structure formed by the method.

11 Claims, 4 Drawing Sheets

METHOD OF FORMING BARRIER LAYER OVER VIA, AND VIA STRUCTURE FORMED THEREOF

BACKGROUND

Field of Invention

The present invention relates to a method of forming a barrier layer over a via, and a via structure formed thereof.

Description of Related Art

In the manufacturing of semiconductor device, a metallization process is adopted to construct interconnection and contacts among various components on a single substrate. Copper interconnect having vias or trenches has been widely employed in semiconductor manufacturing with the advantages of low electrical resistance and high speed transmission.

However, copper metal is prone to electromigration, causing malfunction of the semiconductor device. A barrier layer deposited into the vias or trenches must completely cover the underlying copper metal to protect the copper metal from electromigration.

Poor step coverage of the barrier layer in the vias or trenches is often encountered, especially for those having a high aspect ratio. Poor step coverage of the barrier layer could bring some undesired drawbacks to the subsequent manufacturing process of the semiconductor device. Therefore, there is a need to develop a method that may improve the step coverage of the barrier layer.

SUMMARY

The invention provides a method of forming a barrier layer over a via or a trench. The method includes operations of generating a high density plasma in a chamber and depositing a barrier material over the via or the trench by using the high density plasma. The depositing of the barrier material includes at least a first deposition step, a second deposition step and a third deposition step in sequence. The first, second and third deposition steps is respectively performed under a first bias power, a second bias power and a third bias power. The third bias power is greater than the second bias power, and the second bias power is greater than the first bias power.

In some embodiments of the present invention, the barrier material includes titanium nitride, tungsten nitride, tantalum nitride, indium oxide, cobalt, ruthenium, and tantalum.

In some embodiments of the present invention, the first bias power ranges from 100 W to 550 W.

In some embodiments of the present invention, the second bias power ranges from 550 W to 800 W.

In some embodiments of the present invention, the third bias power ranges from 800 W to 1200 W.

In some embodiments of the present invention, prior to the depositing of the barrier material, the method further includes depositing an adhesion layer on the via or the trench.

In some embodiments of the present invention, the adhesion layer is consisting of titanium (Ti).

In some embodiments of the present invention, the barrier material is deposited over a bottom surface and a sidewall of the via or the trench.

In some embodiments of the present invention, the barrier layer is deposited to have a thickness of 20 Å to 300 Å over the bottom surface of the via or the trench.

In some embodiments of the present invention, the barrier layer is deposited to have a thickness of 20 Å to 300 Å over the sidewall of the via or the trench.

In some embodiments of the present invention, the depositing of the barrier material further includes a fourth deposition step after the third deposition step. The fourth deposition step is performed under a fourth bias power.

The invention further provides a via structure. The via structure includes a dielectric layer, an adhesion layer, and a barrier layer. The dielectric layer includes a via, the via has a sidewall and a bottom surface. The adhesion layer is disposed on the sidewall and the bottom surface of the via. The barrier layer is disposed over the adhesion layer, and is formed by depositing a barrier material over the via. The depositing of the barrier material includes at least a first deposition step, a second deposition step and a third deposition step in sequence. The first, second and third deposition steps is respectively performed under a first bias power, a second bias power and a third bias power. The third bias power is greater than the second bias power, and the second bias power is greater than the first bias power.

In some embodiments of the present invention, the barrier layer is deposited on the sidewall and the bottom surface of the via. The barrier layer has a thickness of 20 Å to 300 Å on the sidewall and a thickness of 20 Å to 300 Å on the bottom surface.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

Figure 1:
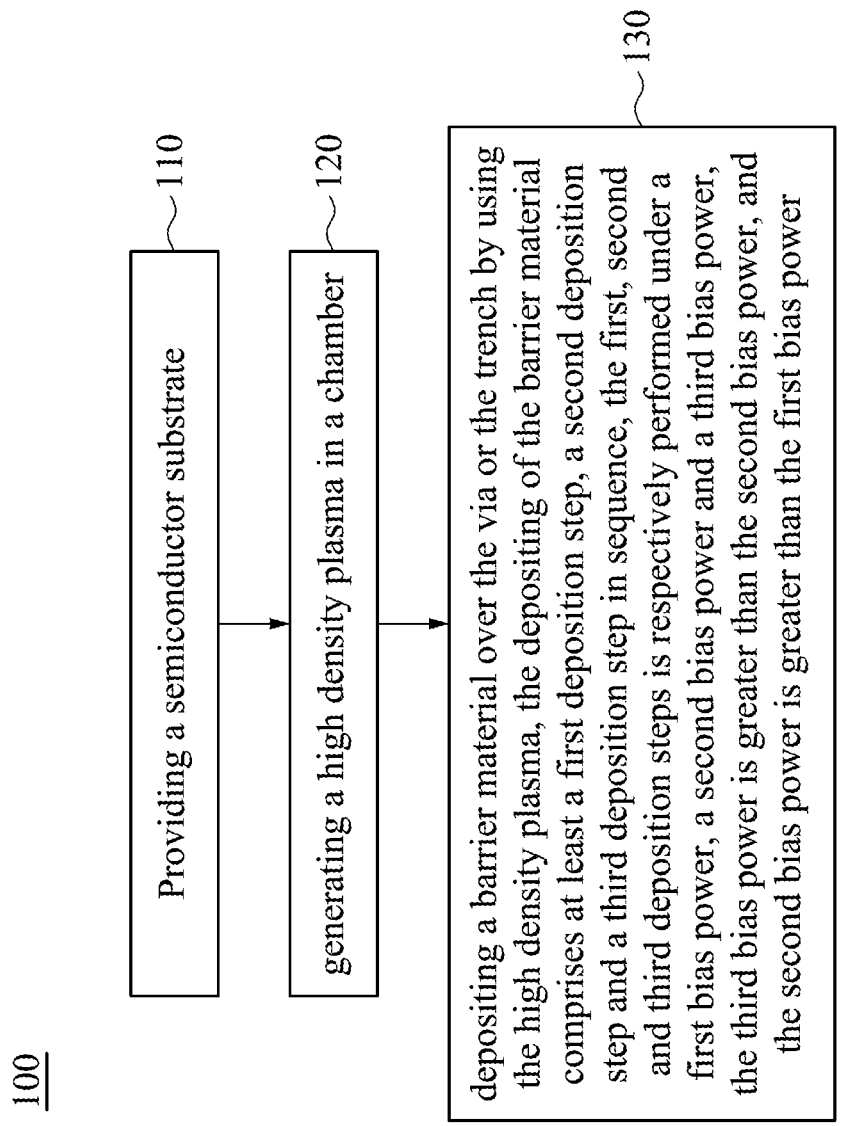
FIG. 1 is a flow chart of a method for processing a semiconductor device according to some embodiments of this invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
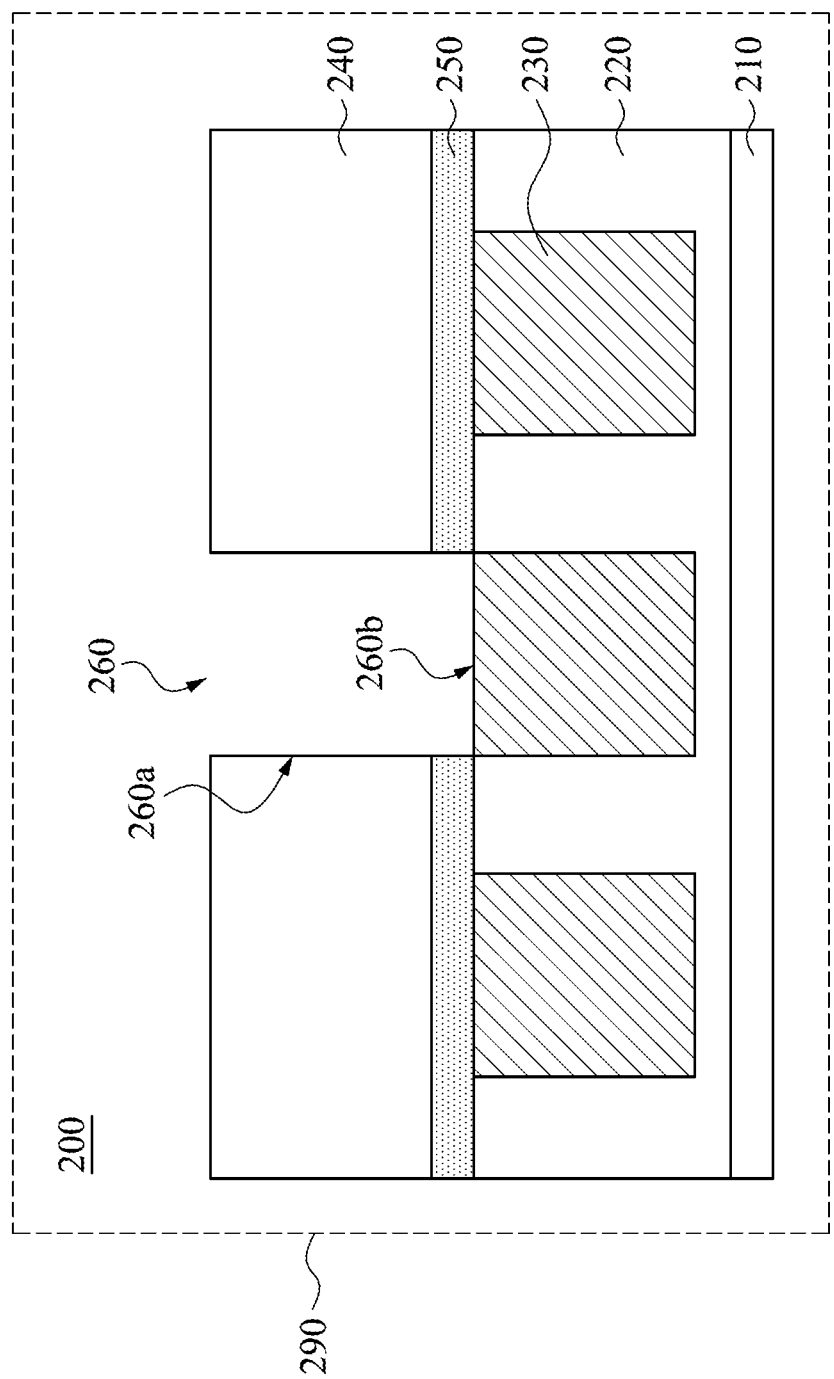
FIG. 2A to FIG. 2C are illustrative cross-sectional views of a semiconductor device during various manufacturing stages according to some embodiments of this invention.

The invention provides a method of forming a barrier layer over a via or a trench. FIG. 1 is a flow chart of a method 100 for processing a semiconductor device according to some embodiments of this invention. Method 100 includes operation 110, operation 120, and operation 130. Please refer to operation 110 and FIG. 2A. In operation 110, a semiconductor substrate 200 is provided, in which an illustrative cross-sectional view of the semiconductor substrate 200 is depicted in FIG. 2A. The semiconductor substrate 200 includes a substrate 210 and a first dielectric layer 220 formed on the substrate 210. The substrate 210 may be made of any suitable substrate, such as silicon, silicon germanium (SiGe), or the like. The first dielectric layer 220 is made of a low-k dielectric material, such as silicon dioxide, silicon carbide hydroxide (SiCOH), or the like.

A plurality of conductive region 230 is formed in the first dielectric layer 220. In some embodiments, the conductive region 230 may be a part of a metallized interconnect structure. In some embodiments, the conductive region 230 is made of metal, such as copper, aluminum, tungsten, alloys thereof, or combinations thereof.

A second dielectric layer 240 is partially disposed over a portion of the first dielectric layer 220, in which an etch stop layer 250 is formed between the partially disposed first dielectric layer 220 and the portion of the second dielectric layer 240. In some embodiments, the second dielectric layer 240 is formed of a same material with the first dielectric layer 220. In some embodiments, the etch stop layer 250 is made of silicon nitride.

A via 260 is formed in the second dielectric layer 240 and etch stop layer 250, and is disposed on one of the conductive region 230. The via 260 is defined by a sidewall 260a and a bottom surface 260b. The via 260 may have a high aspect ratio. For example, a ratio of a height of the sidewall 260a to a width of the bottom surface 260b is about 2:1 to about 4:1. The semiconductor substrate 200 is disposed in a chamber 290 for subsequent processing. In some embodiments, the via 260 may be a trench.

Figure 2B:
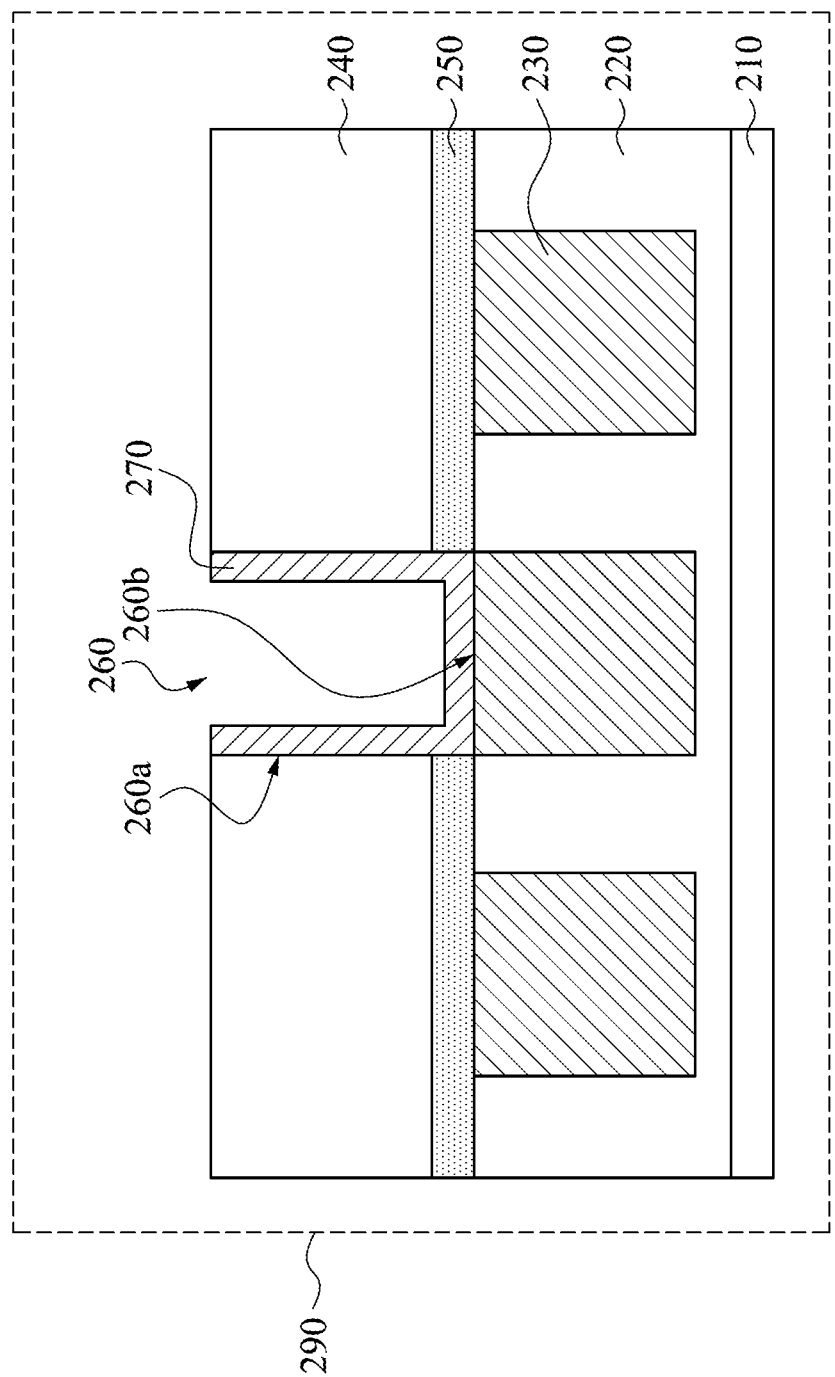

In some embodiments, the semiconductor substrate 200 may further include an adhesion layer 270, as shown in FIG. 2B. The adhesion layer 270 conformally covers the sidewall 260a and the bottom surface 260b of the via 260. In some examples, the adhesion layer 270 includes, or consists of titanium (Ti).

Please refer to operation 120. In operation 120, high density plasma is generated in the chamber 290. In some embodiments, the high density plasma is generated in a sputtering process. To be specific, the sputtering process is used for conformally depositing one or more layers onto the sidewall 260a and the bottom surface 260b of the via 260. In embodiments, the high density plasma may be DC/RF coupled plasma. For example, the DC power used for generating high density plasma may be about 19,000 W to about 57,000 W, more preferably is about 30,000 W to about 45,000 W, such as 35,000 W, 38,000 W or 42,000 W. In some embodiments, a bias power (i.e., AC power) is applied to the processing chamber for directing the bombarded particles to the substrate. In examples, the AC power may be about 100 W to about 3000 W, more preferably is about 200 W to about 2000 W, such as 500 W, 750 W, or 1000 W.

Figure 2C:
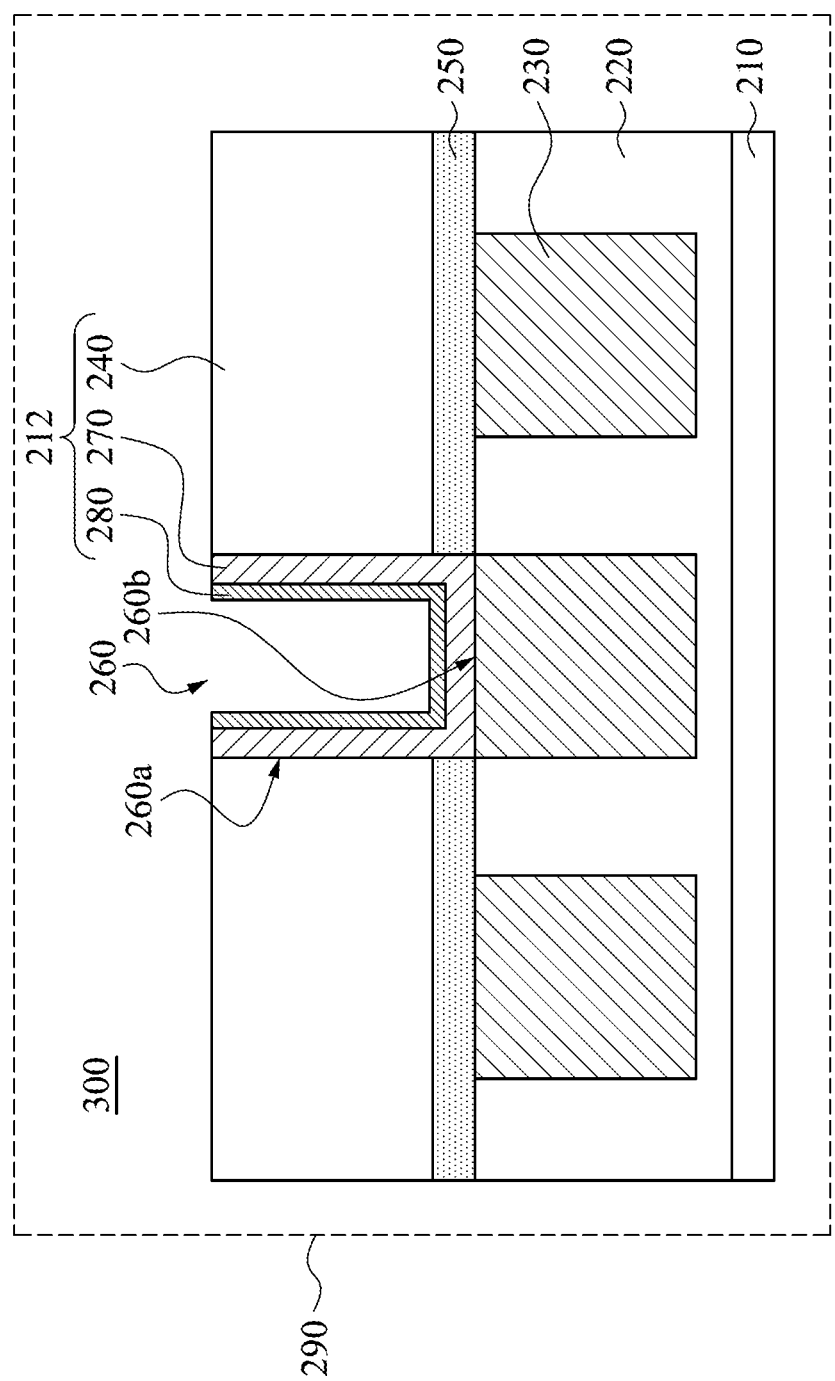

Please refer to operation 130 and FIG. 2C. In operation 130, a barrier material is deposited over the via 260 to form a barrier layer 280 using the high density plasma. It is noted that the operation 130 may be performed after the operation 120, or the operation 130 and the operation 120 may be concurrently performed. Before the forming of the barrier layer 280, the adhesion layer 270 is formed onto the sidewall 260a and the bottom surface 260b of the via 260 as described previously. In other words, the barrier layer 280 is formed conformally on the adhesion layer 270.

The barrier layer 280 may be formed by physical vapor deposition (PVD) of sputtering process. In some embodiments, the physical vapor deposition includes generating the high density plasma for sputtering process. The barrier layer 280 may be conformally deposited on the sidewall 260a and the bottom surface 260b of the via 260 or conformally disposed on the adhesion layer 270. It is noted that, the adhesion layer 270 may not necessary present.

The depositing of the barrier material to form the barrier layer 280 includes at least a first deposition step, a second deposition step and a third deposition step in sequence. Each of the first, second and third deposition steps are respectively performed under a DC power and a bias power (AC power).

In some embodiments, the DC power used in the first, second and third deposition steps is about 19,000 W to about 57,000 W, more preferably is about 30,000 W to about 45,000 W, such as 35,000 W, 38,000 W, or 42,000 W. In example, the value of the DC power is set to be the same throughout the first, second and third deposition steps.

Specifically, the first, second and third deposition steps are respectively performed under a first bias power, a second bias power and a third bias power. It is noted that the third bias power is greater than the second bias power, and the second bias power is greater than the first bias power.

In some embodiments of the present invention, the first bias power used for depositing the barrier layer 280 ranges from 100 W to 550 W, such as 200 W, 300 W, 400 W, or 500 W. In some embodiments of the present invention, the second bias power used for depositing the barrier layer 280 ranges from 550 W to 800 W, such as 600 W, 650 W, 700 W, or 750 W. In some embodiments of the present invention, the third bias power used for depositing the barrier layer 280 ranges from 800 W to 1200 W, such as 850 W, 900 W, 1000 W or 1100 W.

The combination of the first, second and third deposition steps may improve the step coverage of the barrier layer 280. Specifically speaking, as the barrier layer 280 is deposited under the first bias power which is ranged from 100 W to 550 W, an enhanced deposition rate of the barrier layer 280 on the sidewall 260a is achieved, which results in an appropriate thickness of the barrier layer 280 on the sidewall 260a and a shorten deposition time.

In addition, as the barrier layer 280 is deposited under the second bias power and the third bias power respectively ranged from 550 W to 800 W and 800 W to 1200 W, an enhanced deposition rate of the barrier layer 280 on the bottom surface 260b is achieved, which results in a greater thickness of the barrier layer 280 on the bottom surface 260b, as well as the coverage on the vicinity of the bottom corner. In other words, the uniformity of the thickness of the barrier layer 280 formed over the sidewall 260a and the bottom surface 260b is improved by the combination of the first, second and third deposition steps, hence the step coverage is improved. The deposition time may also be shorten due to the enhanced deposition rate.

In addition, the applied second bias power and the third bias power, which are ranged from 550 W to 800 W and 800 W to 1200 W respectively, may further prevent undesired excessive deposition of the barrier material on the top surface of the second dielectric layer 240 (which is known as overhead).

In some embodiments of the present invention, the barrier material for forming the barrier layer 280 includes titanium nitride, tungsten nitride, tantalum nitride, indium oxide, cobalt, ruthenium, and tantalum. In some embodiments, the barrier material is titanium nitride (TiN).

In some embodiments of the present invention, the barrier layer 280 is deposited to have a thickness of 20 Å to 300 Å over the sidewall 260a and the bottom surface 260b of the via 260. If the thickness of the barrier layer 280 is less than 20 Å, the material of the conductive region 230 that is disposed under the via 260 may migrate into the via 260, causing dysfunction of the semiconductor substrate. If the thickness of the barrier layer 280 is greater than 300 Å, a higher electrical resistance may be contributed by the barrier layer 280 and therefore influencing the electrical properties of the semiconductor substrate.

Alternatively, the method of the present invention may include a plurality of deposition steps of the barrier material. Namely, more than three deposition steps may be used in the depositing of the barrier layer 280. As described previously, as the barrier layer 280 is deposited under the bias power of 100 W to 550 W, an enhanced deposition rate of the barrier layer 280 on the sidewall 260a is achieved. Meanwhile, as the barrier layer 280 is deposited under the bias power of 550 W to 800 W or 800 W to 1200 W, an enhanced deposition rate of the barrier layer 280 on the bottom surface 260b as well as the vicinity of the bottom corner is achieved. Therefore, the number of the deposition steps and the value of the bias power may be selected to meet the actual needs.

For instance, the depositing of the barrier material to form the barrier layer 280 further includes a fourth deposition step between the first deposition step and the second deposition step. The fourth deposition step is performed under a fourth bias power. The fourth bias power may be selected in the range of 100 W to 550 W.

In yet another example, the depositing of the barrier material to form the barrier layer 280 further includes a fifth deposition step between the second deposition step and the third deposition step. The fifth deposition step is performed under a fifth bias power. The fifth bias power may be selected in the range of 550 W to 800 W.

In yet another example, the depositing of the barrier material to form the barrier layer 280 further includes a sixth deposition step after the third deposition step. The sixth deposition step is performed under a sixth bias power. The sixth bias power may be selected in the range of 800 W to 1200 W.

The invention further provides a semiconductor substrate 300 having a via structure 212, as shown in FIG. 2C. The via structure 212 includes a dielectric layer 240, an adhesion layer 270, and a barrier layer 280. The dielectric layer includes a via 260, the via 260 has a sidewall 260a and a bottom surface 260b. The adhesion layer 270 is disposed on the sidewall 260a and the bottom surface 260b of the via 260. The barrier layer 280 is disposed on the adhesion layer 270, and is formed by depositing a barrier material over the via 260. The depositing of the barrier material includes at least a first deposition step, a second deposition step and a third deposition step in sequence. The first, second and third deposition steps is respectively performed under a first bias power, a second bias power and a third bias power. The third bias power is greater than the second bias power, and the second bias power is greater than the first bias power.

In some embodiments of the present invention, the first bias power used for depositing the barrier layer 280 ranges from 100 W to 550 W, such as 200 W, 300 W, 400 W, or 500 W. In some embodiments of the present invention, the second bias power used for depositing the barrier layer 280 ranges from 550 W to 800 W, such as 600 W, 650 W, 700 W, or 750 W. In some embodiments of the present invention, the third bias power used for depositing the barrier layer 280 ranges from 800 W to 1200 W, such as 850 W, 900 W, or 950 W.

The combination of the first, second and third deposition steps may improve the step coverage of the barrier layer 280. Specifically speaking, as the barrier layer 280 is deposited under the first bias power which is ranged from 100 W to 550 W, an enhanced deposition rate of the barrier layer 280 on the sidewall 260a is achieved, which results in an appropriate thickness of the barrier layer 280 on the sidewall 260a and a shorten deposition time.

Meanwhile, as the barrier layer 280 is deposited under the second bias power and the third bias power, which is ranged from 550 W to 800 W and 800 W to 1200 W respectively, an enhanced deposition rate of the barrier layer 280 on the bottom surface 260b is achieved, which results in a greater thickness of the barrier layer 280 on the bottom surface 260b, as well as the coverage on the vicinity of the bottom corner. In other words, the uniformity of the thickness of the barrier layer 280 formed over the sidewall 260a and the bottom surface 260b is improved by the combination of the first, second and third deposition steps, hence the step coverage is improved. The deposition time may also be shorten due to the improved deposition rate.

In addition, the applied second bias power and the third bias power, which is ranged from 550 W to 800 W and 800 W to 1200 W respectively, may further prevent undesired excessive deposition of the barrier material on the top surface of the dielectric layer 240 (which is known as overhead).

In some embodiments of the present invention, the barrier layer 280 is deposited on the sidewall 260a and the bottom surface 260b of the via 260. The barrier layer 280 has a thickness of 20 Å to 300 Å on the sidewall 260a and a thickness of 20 Å to 300 Å on the bottom surface 260b. If the thickness of the barrier layer 280 is less than 20 Å, the material of the conductive region 230 that is disposed under the via 260 may migrate into the via 260, causing dysfunction of the semiconductor substrate 300 having the via structure 212. If the thickness of the barrier layer 280 is greater than 300 Å, a higher electrical resistance may be contributed by the barrier layer 280 and therefore influencing the electrical properties of the semiconductor substrate 300.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of forming a barrier layer over a via or a trench, comprising operations of:
generating a high density plasma in a chamber; and
depositing a barrier material over the via or the trench by using the high density plasma, wherein the depositing the barrier material comprises at least a first deposition step, a second deposition step and a third deposition step in sequence, the first, second and third deposition steps is respectively performed under a first bias power, a second bias power and a third bias power, the third bias power is greater than the second bias power, and the second bias power is greater than the first bias power.

2. The method of claim 1, wherein the barrier material comprises titanium nitride, tungsten nitride, tantalum nitride, indium oxide, cobalt, ruthenium, and tantalum.

3. The method of claim 1, wherein the first bias power ranges from 100 W to 550 W.

4. The method of claim 1, wherein the second bias power ranges from 550 W to 800 W.

5. The method of claim 1, wherein the third bias power ranges from 800 W to 1200 W.

6. The method of claim 1, prior to the depositing of the barrier material, the method further comprises depositing an adhesion layer on the via or the trench.

7. The method of claim 6, wherein the adhesion layer comprises titanium (Ti).

8. The method of claim 1, wherein the barrier material is deposited over a bottom surface and a sidewall of the via or the trench.

9. The method of claim 8, wherein the barrier layer is deposited to have a thickness of 20 Å to 300 Å over the bottom surface of the via or the trench.

10. The method of claim 8, wherein the barrier layer is deposited to have a thickness of 20 Å to 300 Å over the sidewall of the via or the trench.

11. The method of claim 1, wherein the depositing of the barrier material further comprises a fourth deposition step after the third deposition step, the fourth deposition step is performed under a fourth bias power.

* * * * *